(12) United States Patent
Kim

(10) Patent No.: US 10,991,506 B2
(45) Date of Patent: Apr. 27, 2021

(54) SHIELD FOR WIRELESS CHARGING, METHOD OF MANUFACTURING SAME, AND WIRELESS CHARGING DEVICE USING SAME

(71) Applicants: Hyundai Motor Company, Seoul (KR); KIA Motors Corporation, Seoul (KR)

(72) Inventor: Young Min Kim, Siheung-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/455,876

(22) Filed: Jun. 28, 2019

(65) Prior Publication Data
US 2020/0135389 A1    Apr. 30, 2020

(30) Foreign Application Priority Data

Oct. 26, 2018  (KR) .................. 10-2018-0129119

(51) Int. Cl.
| | | |
|---|---|---|
| *H01F 27/36* | (2006.01) | |
| *H01F 27/28* | (2006.01) | |
| *H02J 50/10* | (2016.01) | |
| *H05K 9/00* | (2006.01) | |

(52) U.S. Cl.
CPC ......... *H01F 27/36* (2013.01); *H01F 27/2876* (2013.01); *H01F 27/2885* (2013.01); *H02J 50/10* (2016.02); *H05K 9/0081* (2013.01)

(58) Field of Classification Search
CPC .... H01F 27/36; H01F 27/2876; H01F 27/365; H01F 38/14; H01F 27/2871; H01F 27/085; H01F 27/2885; H01F 27/025; H01F 27/22; H02J 50/70; H02J 50/10; H02J 50/005; H05K 9/0081
See application file for complete search history.

(56) References Cited

U.S. PATENT DOCUMENTS

| | | | | |
|---|---|---|---|---|
| 2007/0191075 | A1* | 8/2007 | Greene | H02J 50/50 |
| | | | | 455/572 |
| 2016/0359337 | A1* | 12/2016 | Von Novak, III | H02J 50/12 |
| 2016/0372948 | A1* | 12/2016 | Kvols | H02J 7/025 |
| 2018/0154781 | A1* | 6/2018 | Ansari | H01F 38/14 |

(Continued)

FOREIGN PATENT DOCUMENTS

| | | |
|---|---|---|
| KR | 1020150090391 A | 8/2015 |
| KR | 1020170076510 | 7/2017 |

*Primary Examiner* — Jared Fureman
*Assistant Examiner* — Esayas G Yeshaw
(74) *Attorney, Agent, or Firm* — Mcdonnell Boehnen Hulbert & Berghoff LLP

(57) ABSTRACT

The present disclosure relates to a shield for wireless charging that is capable of improving the effect of dissipating heat generated in a transmit coil, a method of manufacturing the same, and a wireless charger using the same. The shield for wireless charging according to an embodiment of the present disclosure includes a seating part on which the transmit coil is seated; and a transfer part extended integrally to a lower portion of the seating part to transfer heat generated in the transmit coil, wherein a plurality of transmit coils are seated on the seating part, and a height of a seating area on which each transmit coil is seated is set different from a height of a seating area adjacent to each other.

19 Claims, 8 Drawing Sheets

(56) References Cited

U.S. PATENT DOCUMENTS

2018/0198310 A1* 7/2018 Hwang .................. H01F 27/22
2019/0221353 A1* 7/2019 Hwang .............. H05K 7/20509
2019/0386515 A1* 12/2019 Leem ...................... H02J 50/12

* cited by examiner

Direction of wind

FIG. 8

| division | left transmit coil | | center transmit coil | | right transmit coil | |
| --- | --- | --- | --- | --- | --- | --- |
| | L1(uH) | R1(mΩ) | L2(uH) | R2(mΩ) | L3(uH) | R3(mΩ) |
| comparative example 1-1 | 12.4 | 85 | 11.5 | 81 | 12.3 | 83 |
| comparative example 1-2 | 12.4 | 82 | 11.5 | 80 | 12.2 | 82 |
| comparative example 1-3 | 12.4 | 85 | 11.6 | 82 | 12.3 | 84 |
| comparative example 1-4 | 12.4 | 83 | 11.6 | 81 | 12.3 | 81 |
| comparative example 1-5 | 12.4 | 77 | 11.5 | 81 | 12.2 | 80 |
| embodiment 1-1 | 12.7 | 86 | 12.3 | 83 | 12.6 | 84 |
| embodiment 1-2 | 12.6 | 83 | 12.3 | 82 | 12.5 | 83 |
| embodiment 1-3 | 12.7 | 86 | 12.4 | 84 | 12.6 | 85 |
| embodiment 1-4 | 12.7 | 84 | 12.4 | 83 | 12.6 | 82 |
| embodiment 1-5 | 12.7 | 78 | 12.3 | 83 | 12.5 | 81 |

SHIELD FOR WIRELESS CHARGING, METHOD OF MANUFACTURING SAME, AND WIRELESS CHARGING DEVICE USING SAME

CROSS REFERENCE TO RELATED APPLICATION

The present application claims priority to Korean Patent Application No. 10-2018-0129119, filed Oct. 26, 2018, the entire contents of which is incorporated herein for all purposes by this reference.

BACKGROUND

Field of the Disclosure

The present disclosure generally relates to a shield for wireless charging, a method of manufacturing the same, and a wireless charger using the same. More particularly, the present disclosure relates to a shield for wireless charging that is capable of improving the effect of dissipating heat generated in a transmit coil, a method of manufacturing the same, and a wireless charger using the same.

Description of the Related Art

Generally, charging of an electronic device is classified into a contact type charging method and a non-contact type charging method.

The contact type charging method is a method in which charging is performed by bringing an electrode to which a battery of an electrical device is connected and an electrode of a power supplying device into direct contact with each other. Such a contact type charging method is generally used in a wide range of applications because of its simple structure. However, there is an inconvenience such as requiring a connection of a connector or the like to physically connect the electrode of the electrical device and the electrode of the power supplying device to each other.

In order to solve this problem of the contact type charging method, the non-contact type charging method has been proposed.

The non-contact charging method, that is, the wireless charging method is a method of charging using electromagnetic induction. According to the non-contact charging method, a primary coil (transmit coil) is equipped in a charger (wireless power transmission device) and a secondary coil (receiving coil) is equipped in the electrical device of a charging target so that the current generated by a magnetic induction method between the primary coil and the secondary coil is converted into energy thereby charging the battery.

FIG. 1 is a block diagram showing a wireless charger to which a general wireless charging method is applied.

As shown in FIG. 1, a wireless charger 20, to which a general wireless charging system is applied, is configured so that a transmit coil 21 is seated in one surface of a shielding plate 22, and a heat dissipating plate 23 is in contact with the other surface of the shielding plate 22. A printed circuit board (PCB) 24 for controlling an operation of the transmit coil 21 is provided, and a casing 25 in which the transmit coil 21, the shielding plate 22, the heat dissipating plate 23, and the PCB 24 are packaged and housed is provided.

When the electrical device 10 having the receiving coil 11 housed therein is placed on the top of the wireless charger 20, the battery (not shown) of the electrical device 10 is charged by the magnetic induction method between the transmit coil 21 of the wireless charger 20 and the receiving coil 11 of the electrical device 10.

Meanwhile, the shielding plate 22 housed in the wireless charger 20 is provided such that the electromagnetic waves generated in the transmit coil 21 are transmitted to the receiving coil 11 of the electrical device 10 while being blocked from reaching other components.

A large amount of heat is generated in the transmit coil 21 and the PCB 24 of the wireless charger 20 during the wireless charging of the electrical device 10 through the wireless charger 20. The heat generated in the transmit coil 21 is transferred to the casing 25 through the shielding plate 22 and the heat dissipating plate 23, and also the heat generated in the PCB 24 is transferred to the casing 25. Such heat has to be dissipated to the outside, but the heat is trapped inside the casing 25. When the heat is trapped inside the casing 25, the heat of the wireless charger 20 may be transferred to the electrical device 10, whereby there are problems that the user's discomfort and operation degradation are caused due to the heat of the electrical device 10.

Meanwhile, in recent years, as the wireless charging method has been commercialized, there has been a demand for high output wireless charger capable of improving the wireless charging efficiency. However, as the output of the wireless charger increases, the charging speed will increase, and the heat will also increase, whereby there is a need for research on effective release of the heat generated in the wireless charger.

SUMMARY

Accordingly, the present disclosure has been made keeping in mind the above problems occurring in the related art, and an object of the present disclosure is to provide a shield for wireless charging that is capable of improving the effect of dissipating heat generated in a transmit coil, a method of manufacturing the same, and a wireless charger using the same, by improving a shielding plate that blocks electromagnetic waves generated in a transmit coil from being transferred to other components.

According to an embodiment of the present disclosure, a shield for shielding electromagnetic waves generated in a transmit coil for a wireless charger includes a seating part on which the transmit coil is seated; and a transfer part extended integrally to a lower portion of the seating part to transfer heat generated in the transmit coil, wherein a plurality of transmit coils are seated on the seating part, and a height of a seating area on which each transmit coil is seated is set different from a height of a seating area adjacent to each other.

The shield may be provided such that a height of a seating area on which a transmit coil seated close to a center of the seating part among the seated transmit coils is seated is set higher than a height of a seating area on which the other transmit coil is seated.

The shield may be provided such that the seating part has a plurality of seating areas on which the transmit coils are seated, and a wall region extended to protrude upwards along edges to surround the plurality of seating areas.

The shield may be provided such that the transfer part has a plurality of air passages formed so that both ends thereof communicate with each other through side surfaces of the transfer part to cause external air to flow.

The shield may be provided such that the transmit coil close to a center of the seating part among the plurality of transmit coils is seated at a position higher than the other transmit coils, and an air passage passing through a lower portion of the transmit coil seated close to the center of the seating part among the plurality of air passages is formed to have a larger flow rate than the other air passages.

The shield may be provided such that the transmit coil close to a center of the seating part among the plurality of transmit coils is seated at a position higher than the other transmit coils, and the air passage passing through a lower portion of the transmit coil seated close to the center of the seating part, with a cavity being formed in the lower portion of the transmit coil, among the plurality of air passages, communicates with the cavity.

The shield may be provided such that the transmit coil close to a center of the seating part among the plurality of transmit coils is seated at a position higher than the other transmit coils, and a spacing distance of the air passage passing through a lower portion of the transmit coil seated close to the center of the seating part among the plurality of air passages is set narrower than spacing distances of the other air passages.

The shield may be provided such that a pipe made of a material having higher thermal conductivity than a material forming the transfer part is provided on an inner wall of the air passage.

The shield may be provided such that the seating part and the transfer part are made of a Mn—Zn based ferrite material or a Ni—Zn based ferrite material.

According to an embodiment of the present disclosure, a method of manufacturing a shield for shielding electromagnetic waves generated in a transmit coil for a wireless charger includes a shielding sheet preparation step of preparing shielding sheets made of a material capable of shielding electromagnetic wave; a foamed plastic preparation step of preparing a foamed plastic by mixing a thermoplastic plastic and a foaming agent; a lamination step of laminating the shielding sheets while interposing the foamed plastic in a predetermined pattern between the shielding sheets to be laminated; and a heat processing step of sintering the laminated shielding sheets while heat-treating the laminated shielding sheets to form an air passage in a predetermined pattern by foaming the foamed plastic.

The method may be provided such that the material capable of shielding electromagnetic waves in the shielding sheet preparation step is a Mn—Zn based ferrite material or a Ni—Zn based ferrite material.

The method may be provided such that the foamed plastic in the foamed plastic preparation step is prepared by mixing the thermoplastic plastic of 5 wt % to 70 wt % and the foaming agent of 30 wt % to 95 wt % and performing hot-injection.

The method may be provided such that the heat processing step includes a first heating process of raising a temperature of the laminated shielding sheets; a foaming process of foaming the foamed plastic due to the raised temperature to form the air passage; a second heating process of raising a temperature of the shielding sheets after the foaming process is completed; and a sintering process of sintering the shielding sheets at a sintering temperature.

The method may be provided such that the foaming process is performed at a temperature range of 180° C. to 230° C. and is maintained for 30 minutes to 2 hours at 230° C., a heating rate at the temperature range of 180° C. to 230° C. being maintained at 1° C./min or less.

The method may be provided such that the sintering process is performed at a temperature range of 1000° C. to 1250° C.

A wireless charger according to an embodiment of the present disclosure includes a transmit coil for wireless charging; a shield having the transmit coil seated on an upper surface thereof to block electromagnetic waves generated in the transmit coil from being propagated in a side direction and a down direction of the transmit coil; and a heat dissipating plate contacting a lower surface of the shield to receive heat generated in the transmit coil via the shield and dissipate the heat to the outside, wherein the shield includes a seating part on which the transmit coil is seated; and a transfer part extended integrally to a lower portion of the seating part to transfer heat generated in the transmit coil, in which a plurality of transmit coils are seated on the seating part, and a height of a seating area on which each transmit coil is seated is set different from a height of a seating area adjacent to each other.

The charger may be provided to further include a casing in which the transmit coil, the shield, and the heat dissipating plate are housed.

A charger may be provided such that the transfer part having a plurality of air passages formed so that both ends thereof communicate with each other through side surfaces of the transfer part to cause external air to flow.

The charger may be provided to further include a casing in which the transmit coil, the shield, and the heat dissipating plate are housed, wherein the casing is equipped with a fan through which external air is introduced to flow in the air passages.

According to an embodiment of the present disclosure, an air passage for air flow is formed in a shield that blocks electromagnetic waves generated in a transmit coil from being transferred to other components, so that heat generated in the transmit coil is dissipated by the air flow in a process of the heat being transferred to the heat dissipating plate via the shield, whereby the heat dissipation effect of the wireless charger can be improved.

By improving the heat dissipation effect of the wireless charger in this manner, it is possible to raise the output of the wireless charger.

BRIEF DESCRIPTION OF THE FIGURES

The above and other objects, features and other advantages of the present disclosure will be more clearly understood from the following detailed description when taken in conjunction with the accompanying drawings, in which:

FIG. 8 is a table showing results of measuring inductance values and resistance values of transmit coils in an embodiment of the present disclosure and comparative examples.

DETAILED DESCRIPTION

Figure 1:
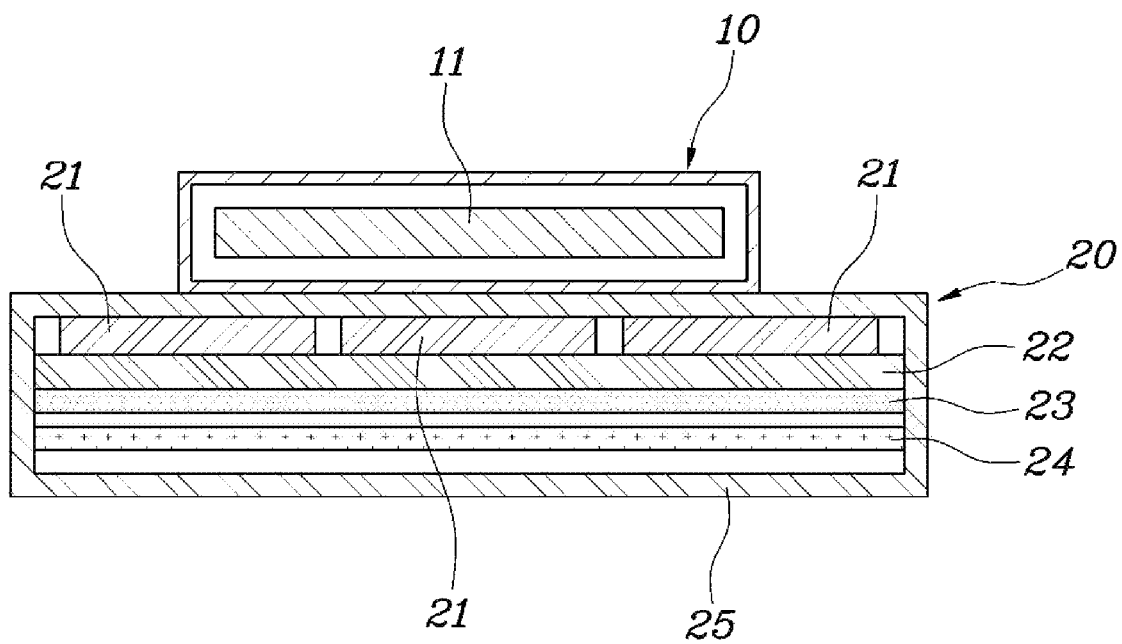
FIG. 1 is a view showing a wireless charger to which a general wireless charging method is applied.

Hereinafter, embodiments of the present disclosure will be described in detail with reference to the accompanying drawings. The present disclosure will now be described more fully hereinafter with reference to the accompanying drawings, in which exemplary embodiments of the present disclosure are shown. These embodiments are provided so that this disclosure will be thorough and complete and will fully convey the scope of the disclosure to those skilled in the art. In the drawings, like reference numerals refer to like elements.

Figure 2:
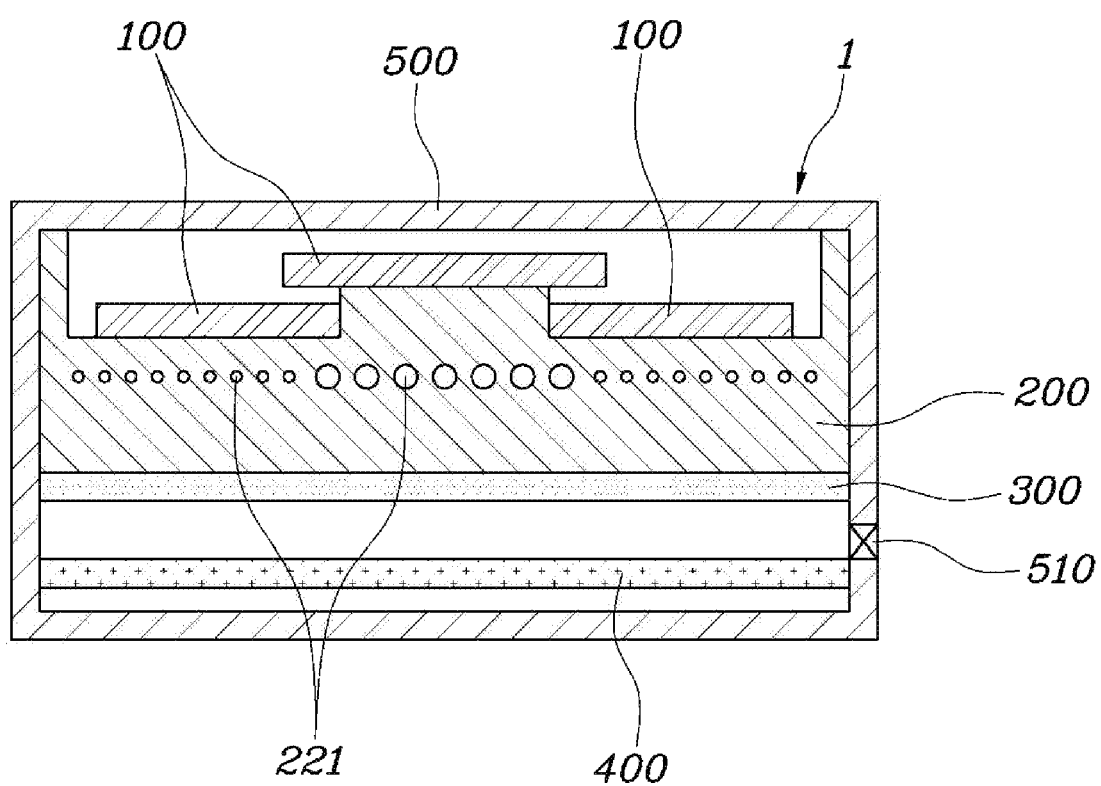
FIG. 2 is a configuration diagram showing a wireless charger according to an embodiment of the present disclosure.
Figure 3:
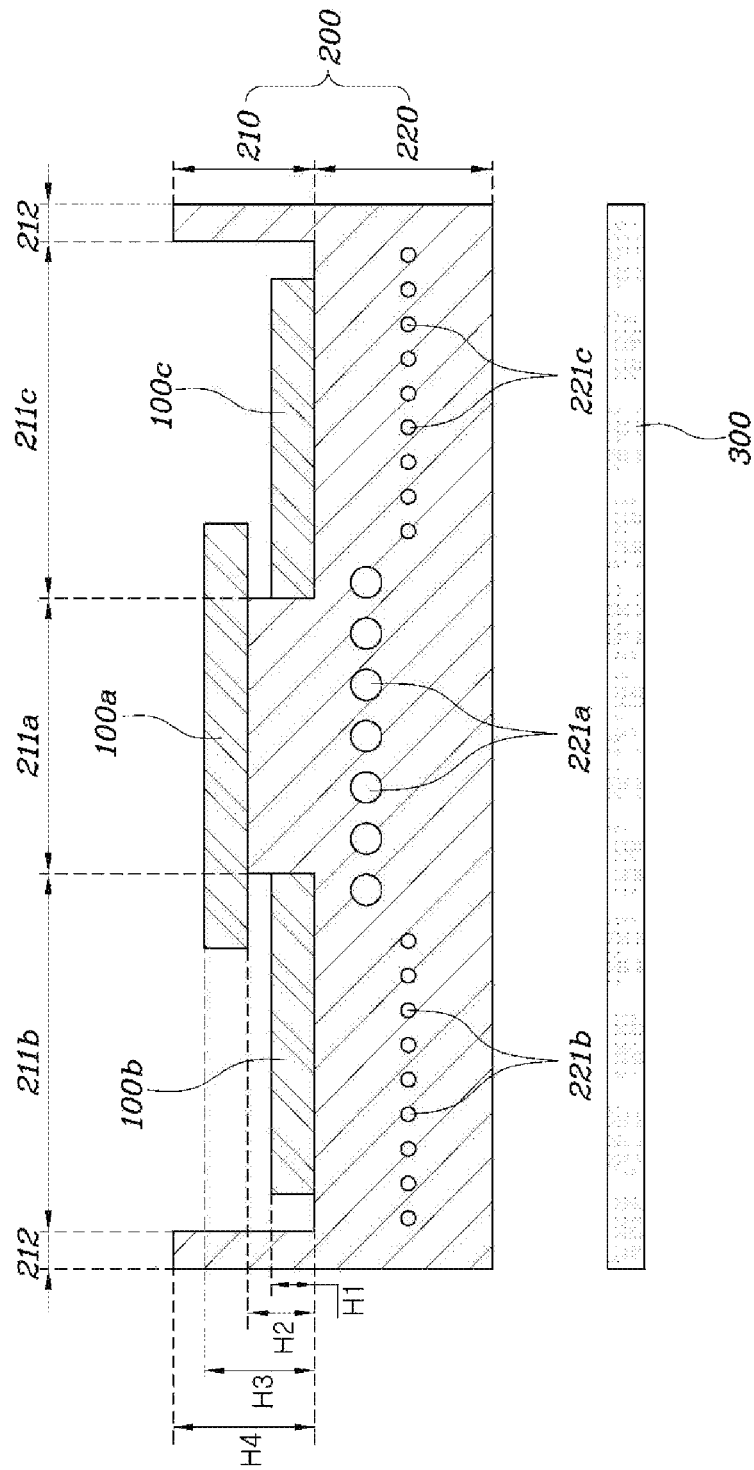
FIG. 3 is a view showing a shield according to an embodiment of the present disclosure.

FIG. 2 is a configuration diagram showing a wireless charger according to an embodiment of the present disclosure, and FIG. 3 is a view showing a shield according to an embodiment of the present disclosure.

As shown in the figures, the wireless charger 1 according to an embodiment of the present disclosure includes a transmit coil 100 for wireless charging; a shield 200 which has the transmit coil 100 seated in the upper surface to block electromagnetic waves generated in the transmit coil 100 from being propagated in a side direction and a down direction of the transmit coil 100; and a heat dissipating plate 300 contacting the lower surface of the shield 200 to receive the heat generated in the transmit coil 100 via the shield 200 and dissipate the heat to the outside. The wireless charger 1 further includes a casing 500 in which the transmit coil 100, the shield 200 and the heat dissipating plate 300 are housed. In this case, various components, such as the PCB 400, constituting the wireless charger 1, for controlling an operation of the transmit coil 100, may be housed in the casing 500.

The transmit coil 100 is a means which is coupled with the receiving coil provided in an electrical device in a magnetic induction manner and may be formed by winding a metal wire such as copper. Herein, the winding shape may be various shapes such as a circular shape, an elliptical shape, a rectangular shape, a diamond shape, and the like, and the overall size, the number of winds, and the like may be appropriately controlled and set according to required characteristics. In addition, as shown in FIGS. 2 and 3, three transmit coils 100 may be disposed, but the present disclosure is not limited thereto. One or more transmit coils 100 may be selectively disposed.

The shield 200 is a means for transmitting electromagnetic waves generated in the transmit coil 100 only to the receiving coil of the electrical device while preventing the electromagnetic waves from reaching other components and made of a material capable of blocking the electromagnetic waves. The transmit coil 100 is disposed on one surface, that is, the upper surface of the shield 200, and the heat dissipating plate 300 is in contact with the other surface, that is, the lower surface of the shield 200. Accordingly, the heat generated in the transmit coil 100 is transferred to the heat dissipating plate 300 via the shield 200. Particularly, in the shield 200, a plurality of air passages 221 are formed so that the external air flows for the purpose of releasing the heat. In addition, when a plurality of the transmit coils 100 are seated, the shield 200 is configured so that heights at which the transmit coils 100 adjacent to each other are seated may be differently applied.

The heat dissipating plate 300 is provided such that the heat generated in the transmit coil 100 is transferred and dissipated through the shield 200 and formed with a plate of aluminum (Al) material having high thermal conductivity. In this case, the upper surface of the heat dissipating plate 300 is in a surface contact with the lower surface of the shield 200, in which the contact area is maximized to make it easy to dissipate the heat generated in the transmit coil 100. However, the material of the heat dissipating plate is not limited to aluminum (Al), and it is possible to apply various materials, such as polymer, metal, ceramic, and the like, having high thermal conductivity and providing desired heat dissipation effect.

The PCB 400 is a circuit configured to control the operation of the transmit coil 100. The PCB 400 may be housed in the wireless charger 1 in various forms and methods without being limited to any particular form and method.

The casing 500 is a means in which components such as the transmit coil 100, the shield 200, the heat dissipating plate 300, and PCB 400 are housed and may be embodied in various forms and manners without being limited to any particular form and manner. However, the casing 500 is further equipped with a fan 510 through which external air is introduced to flow in air passages 221. In addition, the casing 500 may have a discharge port (not shown) for discharging the air introduced into the casing 500 by the fan 510 to the outside. In this case, considering the size and shape of other components in addition to the casing 500, the casing and the other components are designed so that the air introduced into the casing 500 by the fan 510 flows in the air passages 221 formed in the shield 200. In the present embodiment, for convenience of explanation, a close type casing having other components is described as an example. However, when the wireless charger is used as a convenience device in a vehicle, an open type casing will be able to be applied.

The shield has an air passage formed therein, and the air passage which is a main part of the present disclosure will be described in more detail.

The shield 200 includes a seating part 210 on which the transmit coil 100 is seated; and a transfer part 220 integrally extended to the lower portion of the seating part 210 to transfer heat generated in the transmit coil 100. A plurality of air passages 221a, 221b, and 221c are formed in the transfer part 220 so that both ends thereof communicate with each other through the side surfaces of the transfer part 220 to cause external air to flow. Herein, it is preferable that the seating part 210 and the transfer part 220 are integrally formed using a material having shielding performance of an electromagnetic wave. For example, the shield 200, which includes the seating part 210 and the transfer part 220, may be manufactured using an alloy powder based material and a ferrite based material. For example, as the alloy powder based materials, Fe, Fe—Si, Fe—Si—Al, Fe—Si—Cr, Fe—Ni, Fe—Ni—Mo, Fe—Ni—Cr, Fe—Ni—Cu, Fe—Co, Fe—Al, Fe—Ni—Si, Fe—Ni—Mn, and Fe—Ni—Al alloy powder may be used. As the ferrite based material, Mn—Zn, Ni—Zn, Ni—Cu—Zn, and Mg—Cu—Zn ferrite materials may be used. However, it is preferable to use a Mn—Zn ferrite material or a Ni—Zn ferrite material in consideration of shielding efficiency and heat transfer characteristics.

The seating part 210 is formed with seating areas 211a, 211b and 211c on which the transmit coils 100 are seated, and a wall region 212 extended to protrude upwards along the edge to surround the seating areas 211a, 211b and 211c.

Herein, the seating areas 211a, 211b, and 211c may be implemented in various shapes, such as a two-dimensional plane or a three-dimensional shaped step, depending on the number of the transmit coils 100. For example, when three transmit coils 100 are disposed as shown in FIG. 3, the seating areas 211a, 211b, and 211c may be formed with steps to be realized in a three-dimensional shape.

Specifically, the transmit coil 100 is formed in a substantially circular or elliptical shape because the transmit coil 100 is formed by winding a metal wire such as copper. Due to such winding shape of the transmit coil 100, when three transmit coils 100 are disposed on a two-dimensional plane, a region where fewer electromagnetic waves are generated is generated between the transmit coils 100a, 100b and 100c, and charging efficiency may be lowered in each region due to the generation of such region. Thus, in this embodiment, the edges of the transmit coils 100a, 100b and 100c are disposed to overlap with each other, thereby preventing areas where fewer electromagnetic waves are generated from being generated. When the edges of the transmit coils 100a, 100b and 100c are arranged so as to overlap with each other, heights at which the transmit coils 100a, 100b and 100c are arranged may be different from each other in order to block contact between the transmit coils 100a, 100b and 100c. Of course, when an insulating coating is applied to coils constituting the transmit coil, it may be possible to make contact between the transmit coils 100a, 100b and 100c.

On the other hand, when a plurality of transmit coils 100 are provided, most charging for electrical devices is performed in the transmit coil 100a disposed at the center. Therefore, edges of the transmit coils 100 are arranged to overlap with each other, and a height at which the transmit coil 100a disposed at the center is arranged is higher than the other transmit coils 100b and 100c, thereby improving the charging efficiency through the transmit coil 100a disposed at the center.

To this end, a height of the seating areas 211a on which the transmit coil 100a disposed at the center is seated, is set different from heights of the seating areas 211b, 211c adjacent to each other. Preferably, the height of the seating areas 211a on which the transmit coil 100a disposed at the center is seated, is set higher than heights of the seating areas 211b, 211c adjacent to each other. Accordingly, as shown in FIG. 3, the edge of the transmit coil 100a seated in the seating areas 211a is formed at the center, and the edges of the other transmit coils 100b and 100b disposed in the seating areas 211b and 211c adjacent to each other are overlapped in an up and down direction.

Herein, a height difference between the seating areas 211a, 211b, and 211c is greater than a height of the transmit coil 100 so that the transmit coil 100a is prevented from being directly in contact with the other transmit coils 100b and 100c disposed there around.

For example, a height H2 of the seating areas 211a formed at the center is made higher than a height H1 of each of the transmit coils 100b and 100c.

In addition, a height H4 of the wall region 212 formed along the edges of the seating part 210 is set to be equal to or higher than a height H3 of the top of the transmit coil 100a seated in the seating area 211a formed at the center in order to block the electromagnetic waves generated in the transmit coil 100 from being transmitted in the side direction.

On the other hand, when a plurality of transmit coils 100 are provided as described above, since most charging for electrical devices is performed in the transmit coil 100a disposed at the center, most heat is generated in the transmit coil 100a disposed at the center. In order to effectively dissipate the heat generated in the transmit coil 100a disposed at the center, it is preferable that the air passage 221a, of a plurality of air passages 221, passing through the lower portion of the transmit coil 100a seated close to the center of the seating part 210 has a greater flow rate than the other air passage 221b.

As shown in FIG. 3, an inner diameter of the air passage 221a passing through the lower portion of the transmit coil 100a disposed at the center may be set larger than an inner diameter of the other air passage 221b.

On the other hand, the air passage 221 may be variously modified, so that a flow rate of the air passage 221a passing through the lower portion of the transmit coil 100a which is seated close to the center of the seating part 210, is made greater than a flow rate of the other air passage 221b.

Figure 4:
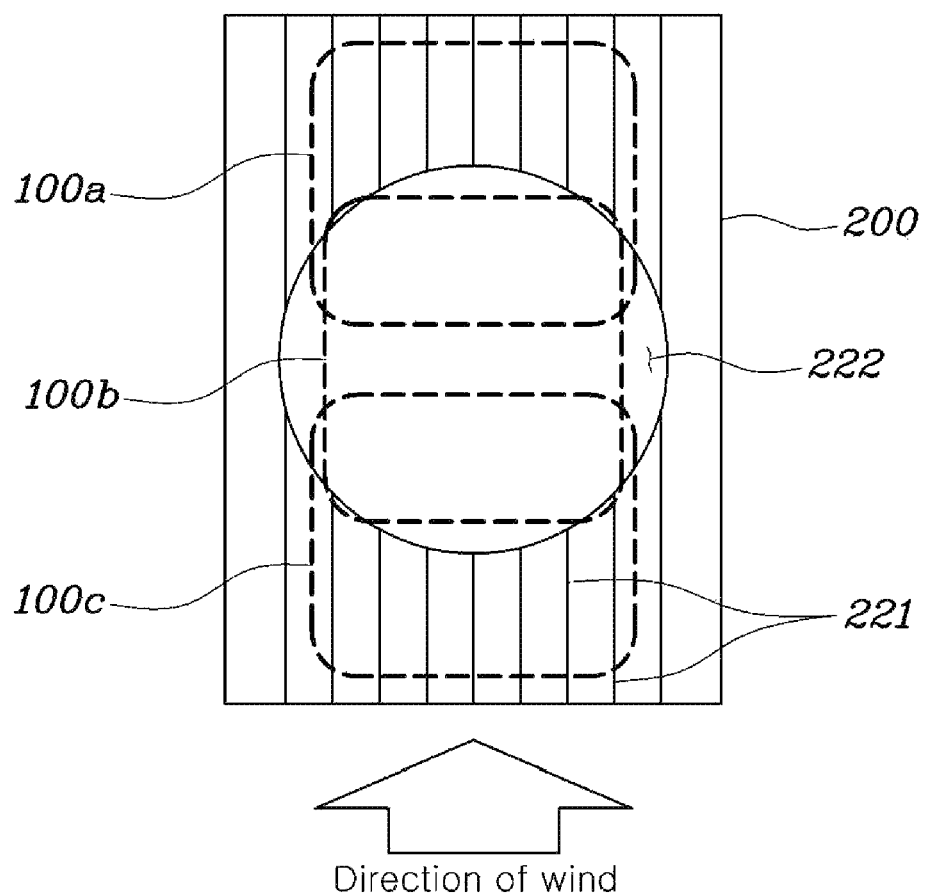
FIG. 4 is a view showing a shield according to another embodiment of the present disclosure.
Figure 5:
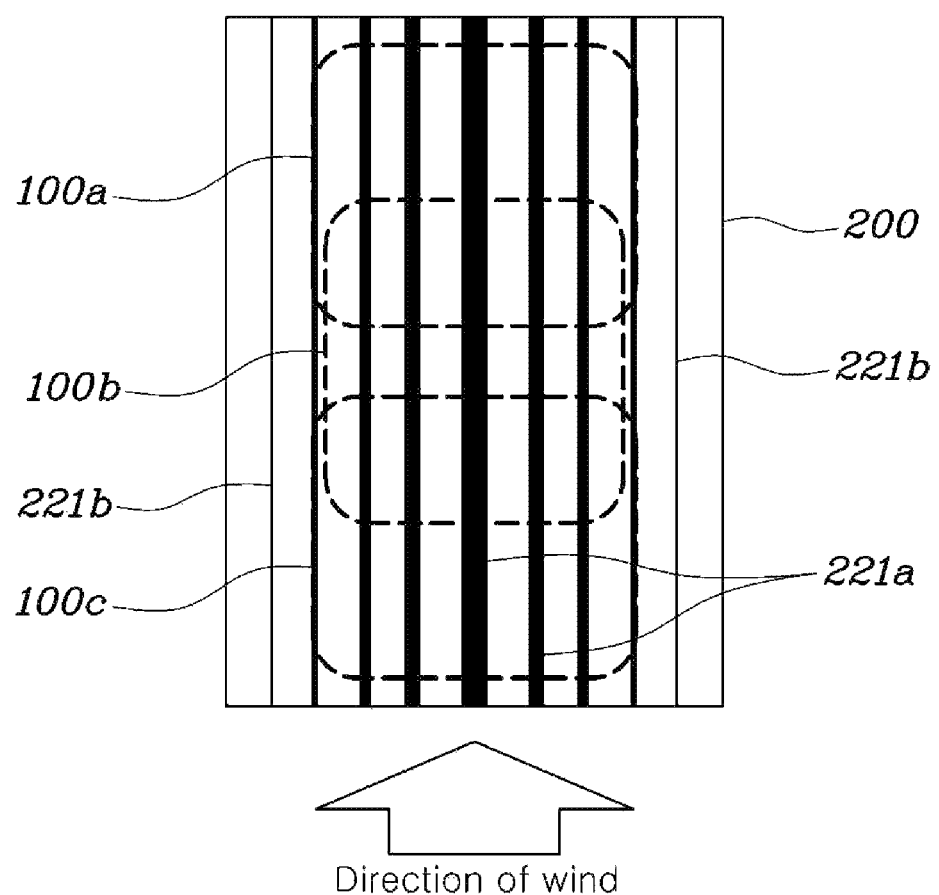
FIG. 5 is a view showing a modification of the shield according to another embodiment of the present disclosure.
Figure 6:
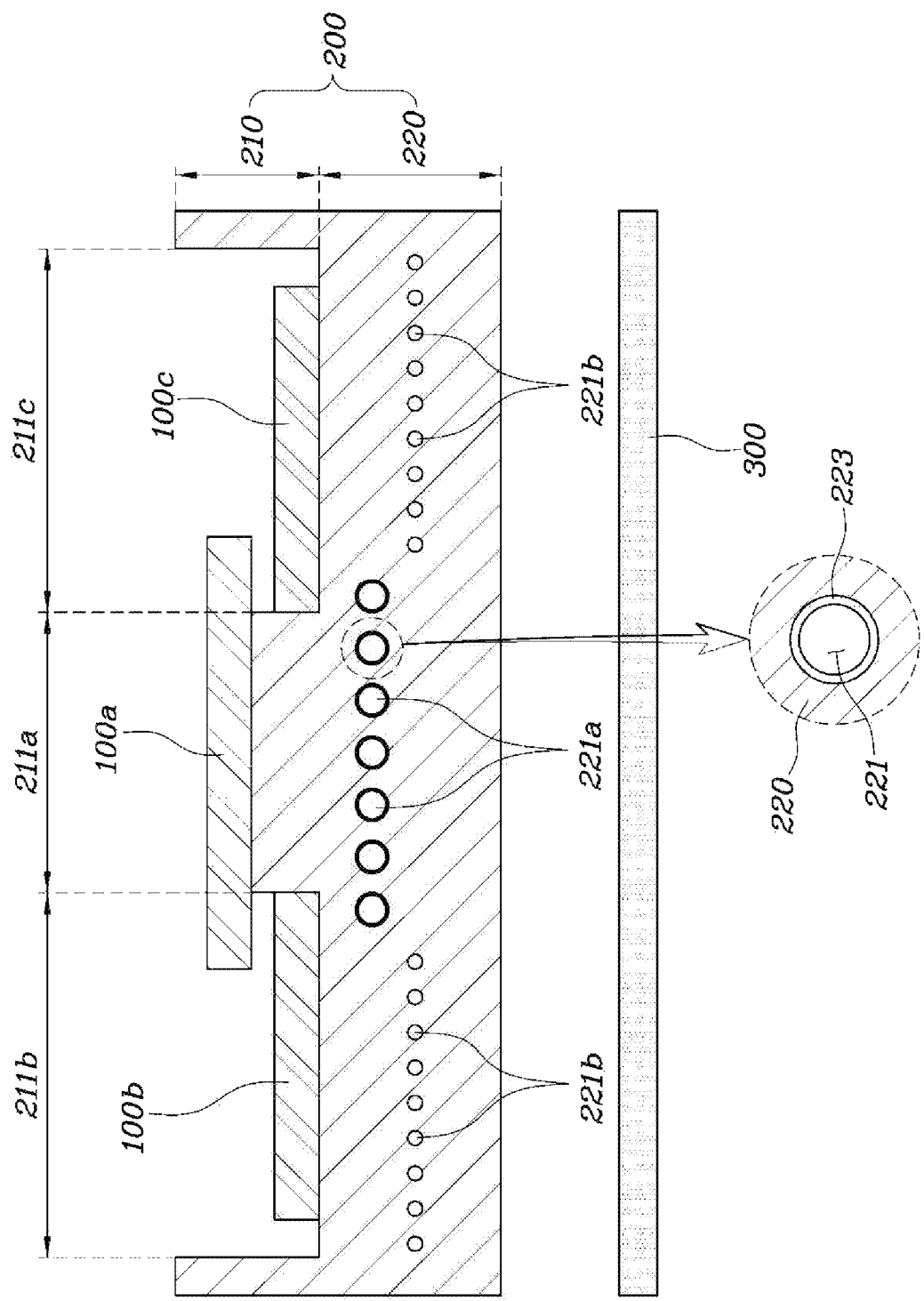
FIG. 6 is a view showing another modification of the shield with a heat transfer means being interposed in the air passage according to another embodiment of the present disclosure.

FIGS. 4 to 6 are views showing a shield according to another embodiment of the present disclosure, in which FIGS. 4 and 5 show a modification of the shield in which the air passage is changed.

As shown in FIG. 4, the transfer part of the shield 200 according to the first modification is provided such that a cavity 222 is formed in a lower portion of the transmit coil 100a disposed at the center, and the air passage 221 passing through the lower portion of the corresponding transmit coil 100a is formed to communicate with the cavity 222. Thus, as the air introduced through the air passage 221 passes through the cavity 222 formed in the lower portion of the transmit coil 100a disposed at the center, the contact area between the air and the shield 200 increases, whereby the heat of the shield 200 may be effectively transferred and dissipated.

Here, the air passages 221 are preferably arranged in parallel along the transmit coils 100a, 100b and 100c arranged in parallel for the purpose of effective heat release.

In addition, as shown in FIG. 5, the shield 200 according to the second modification is provided such that a spacing distance of the air passages 221a passing through the center of the seating part 210 of the plurality of the air passages 221 is narrower than a spacing distance of the other air passage 221b.

In order to cause the spacing distance of the air passage 221a passing through the lower portion of the transmit coil 100a disposed at the center of the seating part 210 to make narrower than the spacing distance of the other air passage 221b, as shown in FIG. 5, as it is closer to the center, an inner diameter of the air passage 221 may be gradually increased thereby making narrow the distance between the air passages.

In addition, the inner diameter of each of the air passages 221 is the same, and the spacing distance of the air passages 221 is made narrower as it is close to the center, whereby the distance between the air passages may be narrowed.

FIG. 6 shows a modification of the shield with a heat transfer means being interposed in the air passage to improve the heat transfer efficiency in the air passage.

As shown in FIG. 6, the shield 200 according to the third modification has a pipe 223 provided on the inner wall of the air passage 221 formed in the transfer part 220, the pipe being made of thermal conductivity higher than that of the material forming the shield 200. For example, the pipe may be formed by using a ceramic-based material having excellent thermal conductivity while maintaining its shape in a sintering process described later. Herein, the pipe may be inserted into all of the air passages or only into the air passage 221a formed close to the center.

A manufacturing method of the shield having the above structure will be described.

A method of manufacturing a shield that shields electromagnetic according to an embodiment of the present disclosure includes a shielding sheet preparation step of preparing shielding sheets made of a material capable of shielding electromagnetic wave; a foamed plastic preparation step of preparing a foamed plastic by mixing thermoplastic plastic and a foaming agent; a lamination step of laminating the shielding sheets while interposing the foamed plastic in a predetermined pattern between the shielding sheets to be laminated; and a heat processing step of sintering the laminated shielding sheets while heat-treating the laminated shielding sheets to form an air passage in a predetermined pattern by foaming the foamed plastic.

The shielding sheet preparation step is a step of preparing the shielding sheets constituting the shield, in which the shielding sheet is prepared by mixing powder and binder made of a Mn—Zn based ferrite material or a Ni—Zn based ferrite material capable of shielding electromagnetic waves and molding them in a sheet shape.

The foamed plastic preparation step is a step of preparing the foamed plastic for forming the air passage, in which the foamed plastic is prepared by mixing the thermoplastic plastic of 5 wt % to 70 wt % and the foaming agent of 30 wt % to 95 wt % and then performing them by hot injection.

In this case, the thermoplastic plastic may be used with a foamed plastic of various materials, such as polyethylene (PE), polypropylene (PP), polyvinyl chloride (PVC), polyurethane (PU), polystyrene (PS), phenol resin (PF), urea resin (UF), polyimide (PI), and the like, and a foaming agent may be used with azodicarbonamide series chemical foaming agent.

Generally, the foamed plastic used for the structure has a content of a foaming agent of about 10 wt %. However, the content of the foaming agent in the present embodiment is higher than the foamed plastic used for the structure and thus is limited to a level of 30 wt % to 95 wt %. This is because the foamed plastic in this embodiment does not require durability but needs to maintain only the initial shape so that the foamed plastic is foamed in a subsequent heat treatment step so as to form the air passage. Therefore, it is preferable that a content of the thermoplastic plastic is limited to a minimal amount, for example, 5 to 70 wt %, in order to allow the foamed plastic to maintain an initial shape thereof and to be burned out by the heat treatment temperature in the heat treatment step.

The lamination step is a step of laminating the prepared shielding sheets in a desired shape, and the seating part may be formed in a three-dimensional shape by cutting the shielding sheets into a predetermined shape as described above. In particular, when a shielding sheet is laminated on a region corresponding to a transfer part of the shield, the shielding sheets are laminated while interposing the foamed plastic between the shielding sheets in a predetermined pattern.

In this case, when interposing the foamed plastic in the predetermined pattern, it is preferable that the predetermined pattern is formed according to the shape of the air passage formed in the shield.

When the lamination of the shielding sheets and the foamed plastic is completed, the shielding sheets are sintered while foaming the foamed plastic through heat treatment.

To this end, the heat processing step includes a first heating process of raising a temperature of the laminated shielding sheets; a foaming process of foaming the foamed plastic due to the raised temperature to form an air passage; a second heating process of raising a temperature of the shielding sheets after the foaming process is completed; and a sintering process of sintering the shielding sheets at a sintering temperature.

The first heating process is the process of heating the shielding sheets and the foamed plastic up to the foaming temperature of the foamed plastic. Herein, the heating atmosphere is not limited to a specific atmosphere.

The foaming process is the process of foaming the foamed plastic to form the air passage between the shielding sheets, and is performed at a temperature range of 180° C. to 230° C. Especially, a heating rate at the temperature range of 180° C. to 230° C. is maintained at 1° C./min or less, so that the foamed plastic is fully foamed (decomposed), the gas generated from the foamed plastic is sufficiently removed, and further the ferrite phase of the shielding sheet does not change into another phase, at the temperature range of 180° C. to 230° C. Also the foamed plastic is fully foamed (decomposed) by causing the foaming process to be maintained for 30 minutes to 2 hours at 230° C.

The foamed plastic is foamed (decomposed) at a temperature range of about 200° C. to 230° C., and gases such as $N_2$, $NH_3$, or $CO_2$, are generated at this time. Such gases escape through the space where the foamed plastic was placed, thereby forming the air passages.

The second heating process is a process of heating the laminated shielding sheets in which the air passages are formed between the shielding sheets, to the sintering temperature of the shielding sheet. Herein, the temperature is raised according to the heating atmosphere of the shielding sheet which is produced commercially.

The sintering process is a process of sintering the shielding sheet to fabricate the shield and is performed at a temperature range of 1000° C. to 1250° C. The heating up to the temperature range in which the sintering process is performed and the sintering atmosphere in which the shielding sheet is maintained at the temperature range of the sintering process are determined according to sintering atmosphere of the shielding sheet that is commercially produced.

Next, the improvement in the heat dissipation effect of the present disclosure will be described by comparing an embodiment of the present disclosure with comparative examples.

Figure 7:
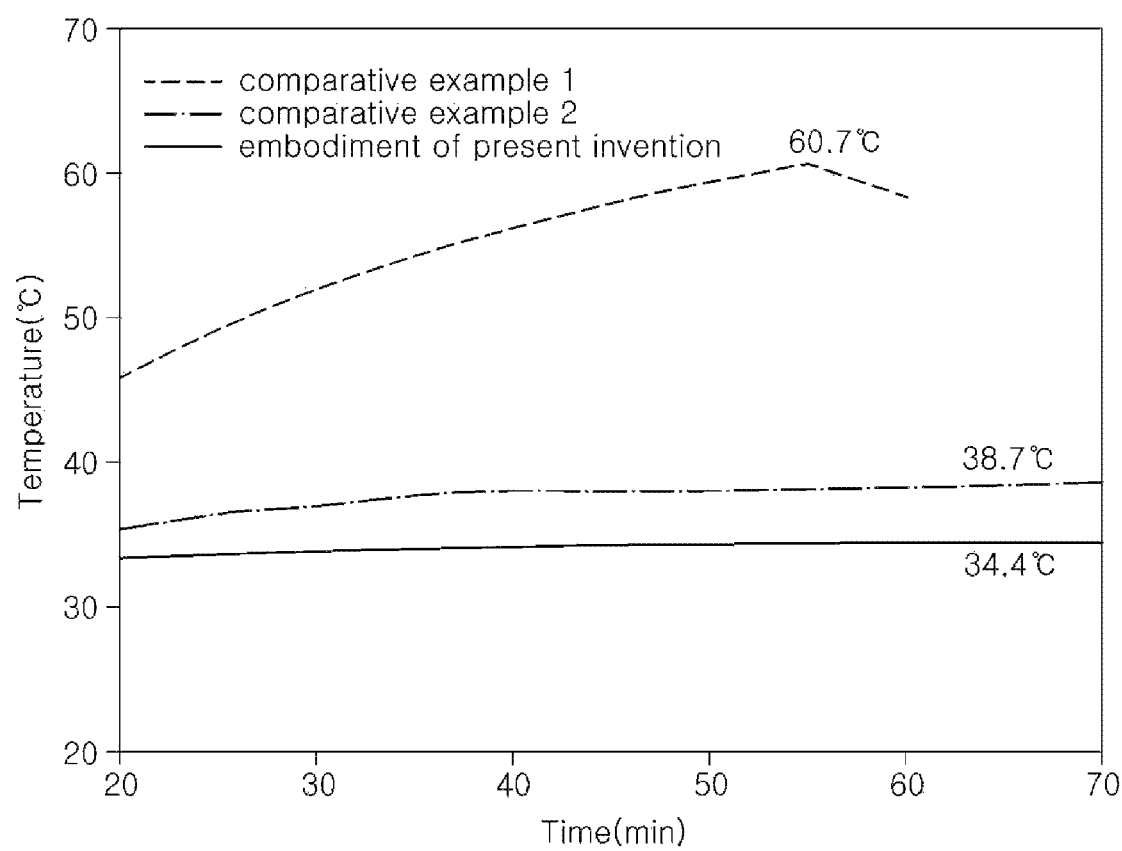
FIG. 7 is a graph showing a result of measuring the surface temperature of a wireless charger over time according to an embodiment of the present disclosure and comparative examples.

According to the heat dissipation experiment, a cellular phone was charged wirelessly with a power of 10 W using a comparative example 1, a comparative example 2, and an embodiment of the present disclosure, and the surface temperature of the wireless charger was measured over time, and the result thereof is shown in FIG. 7.

The comparative example 1 uses the wireless charger equipped with the general shielding plate as shown in FIG. 1, and the comparative example 2 uses a fan capable of introducing external air into the wireless charger of the comparative example 1, whereas the embodiment of the present disclosure uses the wireless charger equipped with the fan and the shield in which the air passage is formed according to the present disclosure.

As appreciated from FIG. 7, it was confirmed that the surface temperature of the wireless charger in the comparative example 2 in which the fan was installed was 22° C. lower than that in the comparative example 1, and it was confirmed that the surface temperature of the wireless charger in the embodiment of the present disclosure was 4° C. or more lower than that in the comparative example 2.

In addition, in order to examine the change of the electromagnetic characteristics according to the shape change of the shield, the inductance value and the resistance value of each of the transmit coils of the comparative example 1 and the embodiment of the present disclosure were measured the results thereof are shown in FIG. 8. In this case, the comparative example 1 has three transmit coils disposed on the same plane, whereas the embodiment of the present disclosure has the transmit coil disposed at the center among three transmit coils are disposed higher than the other transmit coils thereby causing the edges of the transmit coils to be disposed to overlap with each other.

As appreciated from FIG. 8, it was confirmed that the inductance of the transmit coils was improved in the embodiment of the present disclosure as compared with the comparative example 1. When the inductance of the transmit coil is improved, it may be expected that the charging efficiency of the wireless charger is also improved.

Although the present disclosure has been described with reference to the accompanying drawings and the preferred embodiments described above, the present disclosure is not limited thereto but is limited by the following claims. Accordingly, those skilled in the art will appreciate that various modifications and changes may be made thereto without departing from the spirit of the following claims.

The invention claimed is:

1. A shield for shielding electromagnetic waves generated in a transmit coil for a wireless charger, the shield comprising:
   a seating part on which the transmit coil is seated; and
   a transfer part extended integrally to a lower portion of the seating part to transfer heat generated in the transmit coil,
   wherein a plurality of transmit coils are seated on the seating part, and wherein a height of the seating part on which a first transmit coil of the plurality of transmit coils is seated is different from a height of the seating part on which a second transmit coil of the plurality of transmit coils is seated.

2. The shield of claim 1, wherein the first transmit coil is seated close to a center of the seating part, and wherein the height of the seating part on which the first transmit coil is greater than the height of the seating part on which the second transmit coil is seated.

3. The shield of claim 1, wherein the seating part has a plurality of seating areas on which the transmit coils are seated, and a wall region extended to protrude upwards along edges to surround the plurality of seating areas.

4. The shield of claim 1, wherein the transfer part has a plurality of air passages configured so that both ends thereof communicate with each other through side surfaces of the transfer part to cause external air to flow.

5. The shield of claim 4, wherein the transmit coil close to a center of the seating part among the plurality of transmit coils is seated at a position higher than the other transmit coils, and
   an air passage passing through a lower portion of the transmit coil seated close to the center of the seating part among the plurality of air passages is configured to have a larger flow rate than the other air passages.

6. The shield of claim 4, wherein the transmit coil close to a center of the seating part among the plurality of transmit coils is seated at a position higher than the other transmit coils, and
   the air passage passing through a lower portion of the transmit coil seated close to the center of the seating part, with a cavity being provided in the lower portion of the transmit coil, among the plurality of air passages, communicates with the cavity.

7. The shield of claim 4, wherein the transmit coil close to a center of the seating part among the plurality of transmit coils is seated at a position higher than the other transmit coils, and
   a spacing distance of the air passage passing through a lower portion of the transmit coil seated close to the center of the seating part among the plurality of air passages is set narrower than spacing distances of the other air passages.

8. The shield of claim 4, wherein a pipe made of a material having higher thermal conductivity than a material forming the transfer part is provided on an inner wall of the air passage.

9. The shield of claim 1, wherein the seating part and the transfer part are made of a Mn—Zn based ferrite material or a Ni—Zn based ferrite material.

10. A method of manufacturing a shield for shielding electromagnetic waves generated in a transmit coil for a wireless charger, the method comprising:
    a shielding sheet preparation step of preparing shielding sheets made of a material capable of shielding electromagnetic wave;
    a foamed plastic preparation step of preparing a foamed plastic by mixing a thermoplastic plastic and a foaming agent;
    a lamination step of laminating the shielding sheets while interposing the foamed plastic in a predetermined pattern between the shielding sheets to be laminated, wherein the laminated shielding sheets form a seating part on which the transmit coil is seated, and wherein the seating part comprises a first portion having a first height and a second portion with a second height that is different than the first height; and
    a heat processing step of sintering the laminated shielding sheets while heat-treating the laminated shielding sheets to form an air passage in a predetermined pattern by foaming the foamed plastic.

11. The method of claim 10, wherein the material capable of shielding electromagnetic waves in the shielding sheet preparation step is a Mn—Zn based ferrite material or a Ni—Zn based ferrite material.

12. The method of claim 10, wherein the foamed plastic in the foamed plastic preparation step is prepared by mixing the thermoplastic plastic of 5 wt % to 70 wt % and the foaming agent of 30 wt % to 95 wt % and performing hot-injection.

13. The method of claim 10, wherein the heat processing step includes:
    a first heating process of raising a temperature of the laminated shielding sheets;
    a foaming process of foaming the foamed plastic due to the raised temperature to form the air passage;
    a second heating process of raising a temperature of the shielding sheets after the foaming process is completed; and
    a sintering process of sintering the shielding sheets at a sintering temperature.

14. The method of claim 13, wherein the foaming process is performed at a temperature range of 180° C. to 230° C. and is maintained for 30 minutes to 2 hours at 230° C., a heating rate at the temperature range of 180° C. to 230° C. being maintained at 1° C./min or less.

15. The method of claim 13, wherein the sintering process is performed at a temperature range of 1000° C. to 1250° C.

16. A wireless charger, comprising:
    a transmit coil for wireless charging;

a shield having the transmit coil seated on an upper surface thereof to block electromagnetic waves generated in the transmit coil from being propagated in a side direction and a down direction of the transmit coil; and a heat dissipating plate contacting a lower surface of the shield to receive heat generated in the transmit coil via the shield and dissipate the heat to the outside, wherein the shield includes a seating part on which the transmit coil is seated; and a transfer part extended integrally to a lower portion of the seating part to transfer heat generated in the transmit coil, wherein a plurality of transmit coils are seated on the seating part, and wherein a height of the seating part on which a first transmit coil of the plurality of transmit coils is seated is different from a height of the seating part on which a second transmit coil of the plurality of transmit coils is seated.

17. The charger of claim 16, further comprising:
a casing in which the transmit coil, the shield, and the heat dissipating plate are housed.

18. The charger of claim 16, wherein the transfer part having a plurality of air passages configured so that both ends thereof communicate with each other through side surfaces of the transfer part to cause external air to flow.

19. The charger of claim 18, further comprising:
a casing in which the transmit coil, the shield, and the heat dissipating plate are housed,
wherein the casing is equipped with a fan through which external air is introduced to flow in the air passages.

* * * * *